US012602870B2

(12) United States Patent
Banadyha et al.

(10) Patent No.: US 12,602,870 B2
(45) Date of Patent: Apr. 14, 2026

(54) COMPUTER-AIDED TECHNIQUES FOR DESIGNING 3D SURFACES BASED ON GRADIENT SPECIFICATIONS

(71) Applicant: AUTODESK, INC., San Francisco, CA (US)

(72) Inventors: Andriy Banadyha, Cambridge (GB); Mark Thomas Davis, Mill Valley, CA (US)

(73) Assignee: AUTODESK, INC., San Francisco, CA (US)

( * ) Notice: Subject to any disclaimer, the term of this patent is extended or adjusted under 35 U.S.C. 154(b) by 0 days.

(21) Appl. No.: 18/419,443

(22) Filed: Jan. 22, 2024

(65) Prior Publication Data

US 2024/0242437 A1    Jul. 18, 2024

Related U.S. Application Data

(63) Continuation of application No. 17/746,784, filed on May 17, 2022, now Pat. No. 11,900,542.

(51) Int. Cl.
G06T 17/20 (2006.01)
G06F 30/12 (2020.01)

(52) U.S. Cl.
CPC .............. G06T 17/20 (2013.01); G06F 30/12 (2020.01); G06T 2200/24 (2013.01); G06T 2210/12 (2013.01); G06T 2210/56 (2013.01)

(58) Field of Classification Search
CPC . G06T 17/20; G06T 2200/24; G06T 2210/12; G06T 2210/56; G06F 30/12
See application file for complete search history.

(56) References Cited

U.S. PATENT DOCUMENTS

| | | | |
|---|---|---|---|
| 7,133,044 B2 * | 11/2006 | Maillot | G06T 17/20 |
| | | | 345/581 |
| 2002/0158880 A1 * | 10/2002 | Williams | G06T 17/20 |
| | | | 345/582 |
| 2009/0190809 A1 * | 7/2009 | Han | G06V 10/755 |
| | | | 382/128 |
| 2019/0088014 A1 * | 3/2019 | Richards | G06T 19/00 |
| 2021/0243362 A1 | 8/2021 | Castillo et al. | |
| 2021/0272345 A1 * | 9/2021 | Lesser | G06T 13/60 |
| 2021/0279950 A1 | 9/2021 | Phalak | |
| 2022/0138359 A1 * | 5/2022 | Sussner | G06F 30/10 |
| | | | 703/1 |
| 2022/0165025 A1 | 5/2022 | Lambert et al. | |
| 2022/0343582 A1 * | 10/2022 | Anton Dominguez | |
| | | | G06F 30/20 |

\* cited by examiner

*Primary Examiner* — Michelle Chin
(74) *Attorney, Agent, or Firm* — Artegis Law Group, LLP

(57) ABSTRACT

In various embodiments, a gradient modeling application automatically generates designs of three-dimensional (3D) objects. The gradient modeling application generates a set of points based on a resolution and a perimeter. The gradient modeling application computes a set of displacement values based on the set of points, a first two-dimensional (2D) border, and a first displacement parameter that is associated with the first 2D border. Based on the set of displacement values, the gradient modeling application generates a 3D object design.

20 Claims, 4 Drawing Sheets

COMPUTER-AIDED TECHNIQUES FOR DESIGNING 3D SURFACES BASED ON GRADIENT SPECIFICATIONS

CROSS-REFERENCE TO RELATED APPLICATIONS

This application is a continuation of the co-pending U.S. patent application titled, "COMPUTER-AIDED TECH-NIQUES FOR DESIGNING 3D SURFACES BASED ON GRADIENT SPECIFICATIONS," filed on May 17, 2022, and having Ser. No. 17/746,784. The subject matter of the related application is hereby incorporated herein by reference.

BACKGROUND

Field of the Various Embodiments

The various embodiments relate generally to computer science and computer-aided design software and, more specifically, to computer-aided techniques for designing 3D surfaces based on gradient specifications.

Description of the Related Art

In the context of three-dimensional ("3D") mechanical design, computer-aided design ("CAD") tools are software applications that are used to streamline the overall design process, which typically includes designing and optimizing multiple 3D objects making up an overarching mechanical design. One drawback of many CAD tools is that generating 3D object designs from scratch within a given CAD tool can be difficult. In particular, aesthetically-pleasing 3D object designs oftentimes are characterized by complex curvilinear or "organic" 3D shapes, and these types of 3D shapes are difficult to specify using conventional CAD tools.

One way of initially generating an aesthetically-pleasing 3D object design for a CAD tool is to hand sculpt modeling clay based on any number of functional requirements, functional preferences, and stylistic preferences to create a 3D clay model of the 3D object. A 3D scanner is subsequently used to generate 3D scan data based on geometrical measurements of the visible surfaces of the 3D clay model. The 3D scan data is then imported into one or more CAD tools. A typical CAD tool can operate on 3D scan data to analyze and generate a 3D object design corresponding to the 3D object. Notably, the 3D object design typically cannot be modified using conventional CAD tools.

One drawback of the above approach is that, because of the inherent inaccuracies associated with hand-sculpting and the inability to modify 3D object designs generated from 3D clay models, numerous design iterations usually are needed to create a clay model that satisfies functional requirements while taking into account functional and stylistic preferences. During a typical design iteration, the clay model is modified based on a review of the corresponding 3D scan data performed using the CAD tool, the 3D scanner is used to re-generate the 3D scan data based on the modified clay model, and the re-generated 3D scan data is imported into the CAD tool for further analysis. Such an iterative design process can be prohibitively time-consuming. Consequently, a designer may decide to over-design the clay model initially to ensure that functional requirements are satisfied at the expense of functional and/or stylistic preferences—something that can reduce the overall quality of the resulting design.

As the foregoing illustrates, what is needed in the art are more effective techniques for generating 3D object designs for CAD tools.

SUMMARY

One embodiment of the present invention sets forth a computer-implemented method for automatically generating designs of three-dimensional (3D) objects. The method includes generating a set of points based on a resolution and a perimeter; computing a set of displacement values based on the set of points, a first two-dimensional (2D) border, and a first value for a first displacement parameter that is associated with the first 2D border; and generating a first 3D object design based on the set of displacement values.

At least one technical advantage of the disclosed techniques relative to the prior art is that, with the disclosed techniques, 3D object designs can be automatically and accurately generated based on parameterized borders representing target curvatures. In that regard, the disclosed techniques allow the depth values of points included in a 3D object design to be automatically adjusted based on distances to parameterized borders, thereby enabling complex 3D curvilinear shapes to be accurately defined and interactively refined based on any number and/or types of requirements and/or preferences. Accordingly, with the disclosed techniques, 3D object designs that satisfy functional requirements while taking into account functional and/or stylistic preferences can be generated automatically and efficiently—something that was not possible with prior art approaches. Consequently, the disclosed techniques can improve the overall quality of 3D object designs relative to what can be achieved using prior art CAD tools. These technical advantages provide one or more technological improvements over prior art techniques.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details. For explanatory purposes, multiple instances of like objects are denoted with reference numbers identifying the object and parenthetical alphanumeric character(s) identifying the instance where needed.

System Overview

Figure 1:
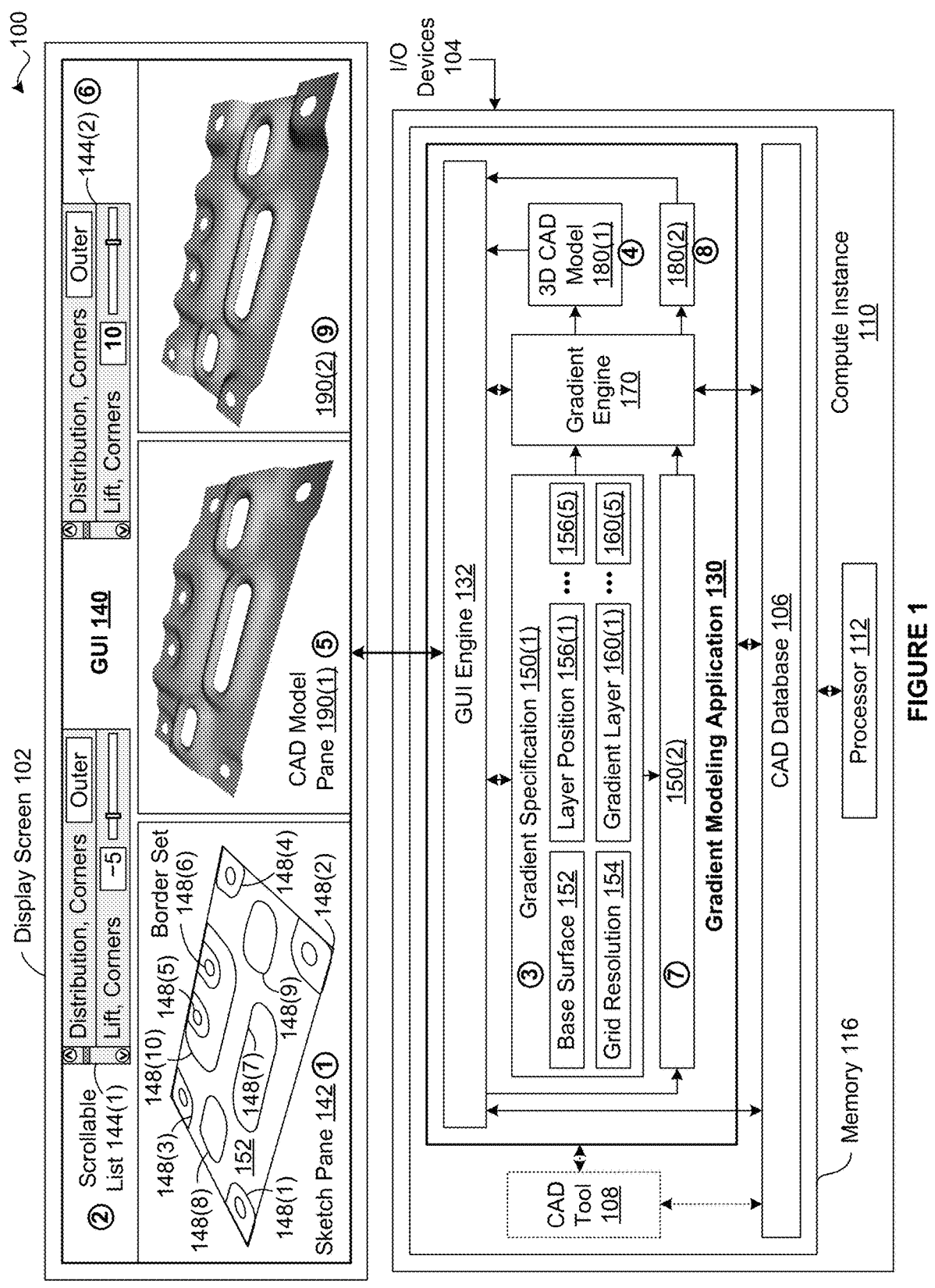
FIG. 1 is a conceptual illustration of a system configured to implement one or more aspects of the various embodiments.

FIG. 1 is a conceptual illustration of a system 100 configured to implement one or more aspects of the various embodiments. As shown, in some embodiments, the system 100 includes, without limitation, a compute instance 110, a display screen 102, and input/output (I/O) devices 104. In some other embodiments, the system 100 can further include, without limitation, one or more other compute instances and/or one or more other display screens. In the same or other embodiments, any number of touchscreens can supplement or replace the display screen 102.

Any number of the components of the system 100 can be distributed across multiple geographic locations or implemented in one or more cloud computing environments (e.g., encapsulated shared resources, software, and data) in any combination. In some embodiments, the compute instance 110 and/or zero or more other compute instances can be implemented in a cloud computing environment, implemented as part of any other distributed computing environment, or implemented in a stand-alone fashion.

As shown, in some embodiments, the compute instance 110 includes, without limitation, a processor 112 and a memory 116. The processor 112 can be any instruction execution system, apparatus, or device capable of executing instructions. For example, the processor 112 could be a central processing unit, a graphics processing unit, a controller, a micro-controller, a state machine, or any combination thereof. The memory 116 of the compute instance 110 stores content, such as software applications and data, for use by the processor 112 of the compute instance 110. In some embodiments, each of any number of other compute instances can include any number of other processors and any number of other memories in any combination. In particular, the compute instance 110 and/or one or more other compute instances can provide a multiprocessing environment in any technically feasible fashion.

The memory 116 can be one or more of a readily available memory, such as random-access memory, read only memory, floppy disk, hard disk, or any other form of digital storage, local or remote. In some embodiments, a storage (not shown) can supplement or replace the memory 116. The storage can include any number and type of external memories that are each accessible to the processor 112. For example, and without limitation, the storage can include a Secure Digital Card, an external Flash memory, a portable compact disc read-only memory, an optical storage device, a magnetic storage device, or any suitable combination of the foregoing.

As shown, in some embodiments, the compute instance 110 is connected to the I/O devices 104. The I/O devices 104 can include, without limitation, one or more devices configured to receive input, one or more devices configured to provide output, one or more devices configured to both receive input and provide output, or any combination thereof. Some examples of devices that can be configured to receive input include, without limitation, a keyboard, a mouse, and a microphone. Some examples of devices that can be configured to provide output include, without limitation, a display device and a speaker. Some examples of devices that can be configured to both receive input and provide output include, without limitation, a touchscreen and a universal serial bus port. In some embodiments, the I/O devices 104 include, without limitation, a display device that can be configured to display any amount and/or types of visual content on the display screen 102 in any technically feasible fashion.

In some embodiments, the compute instance 110 can be integrated with any number and/or types of other devices (e.g., one or more other compute instances and/or the I/O devices 104) into a user device. Some examples of user devices include, without limitation, desktop computers, laptops, smartphones, smart televisions, game consoles, and tablets.

In general, the compute instance 110 is configured to implement one or more software applications. For explanatory purposes only, each software application is described as residing in the memory 116 of the compute instance 110 and executing on the processor 112 of the compute instance 110. In some embodiments, any number of instances of any number of software applications can reside in the memory 116 and/or any number of other memories associated with any number of other compute instances and execute on the processor 112 of the compute instance 110 and/or any number of other processors associated with any number of other compute instances in any combination. In the same or other embodiments, the functionality of any number of software applications can be distributed across any number of other software applications that reside in the memory 116 and/or any number of other memories associated with any number of other compute instances and execute on the processor 112 and/or any number of other processors associated with any number of other compute instances in any combination. Further, subsets of the functionality of multiple software applications can be consolidated into a single software application.

In particular, the compute instance 110 is configured to generate designs of 3D objects or "3D object designs." In some embodiments, the compute instance 110 and/or any number of other compute instances are configured to generate 3D CAD models that digitally represent the 3D object designs. A 3D CAD model is a digital representation of a corresponding 3D object or 3D object design. Some examples of 3D CAD models are boundary representations ("BReps"), quad meshes, T-Spline models, and NURBS models.

As described previously herein, one drawback of many CAD tools is that generating aesthetically-pleasing 3D object designs from scratch within a given CAD tool can be difficult. One way of initially generating an aesthetically-pleasing 3D object design is to hand sculpt modeling clay to create a 3D clay model of the 3D object, use a 3D scanner to generate 3D scan data corresponding to the visible surfaces of the 3D clay model, and import the 3D scan data into one or more CAD tools. One drawback of the above approach is that, because of the inherent inaccuracies associated with hand-sculpting and the inability to modify 3D object designs generated from 3D clay models, numerous design iterations usually are needed to create a clay model that satisfies functional requirements while taking into account functional and stylistic preferences. Consequently, a designer may decide to over-design the clay model initially to ensure that functional requirements are satisfied at the expense of functional and/or stylistic preferences—something that can reduce the overall quality of the resulting design.

Interactively Generating 3D CAD Models Based on Gradient Specifications

To address the above problems, in some embodiments, the compute instance 110 includes, without limitation, a gradient modeling application 130. As described in greater detail below, in some embodiments, the gradient modeling application 130 automatically generates displacement fields based on gradient specifications representing target curvatures. In the same or other embodiments, the gradient modeling application 130 and/or any number and/or types of other software applications automatically generates each of any number and/or types of 3D CAD models based on any number of the displacement fields, where each 3D CAD model represents a 3D object design.

As shown, in some embodiments, the gradient modeling application 130 resides in the memory 116 of the compute instance 110 and executes on the processor 112 of the compute instance 110. In some other embodiments, any number of portions (including all) of the functionality described herein with respect to the gradient modeling application 130 can be distributed across any number of compute instances in any technically feasible fashion. In some embodiments, the gradient modeling application 130 includes, without limitation, a graphical user interface (GUI) engine 132 and a gradient engine 170.

As shown, in some embodiments, the GUI engine 132 enables a user to interactively specify, modify, and display, without limitation, any number of gradient specifications and any amount and/or types of related data within a GUI 140. In the same or other embodiments, in response to any number and/or types of user events received via the GUI 140, the GUI engine 132 causes the gradient engine 170 to generate any number of displacement fields, any number and/or types of 3D object designs, and any number and/or types of 3D CAD models based on any number of gradient specifications. In some embodiments, the GUI engine 132 enables a user to interactively generate, modify, and display, without limitation, any number of displacement fields and any number and/or types of 3D CAD models within the GUI 140.

The GUI 140 can be any type of GUI that is displayed on any number and/or types of display screens in any technically feasible fashion. As shown, in some embodiments, the GUI 140 is displayed on the display screen 102. The GUI engine 132 can perform any number and/or types of operations to display any number and/or types of interactive GUI elements and/or any number and/or types of non-interactive GUI elements within the GUI 140. In some embodiments, each interactive GUI element enables one or more types of user interactions that automatically trigger corresponding user events. Some examples of types of interactive GUI elements include, without limitation, scroll bars, buttons, text entry boxes, drop-down lists, and sliders. In some embodiments, the GUI engine 132 organizes GUI elements into one or more container GUI elements (e.g., panes).

In some embodiments, each gradient specification includes, without limitation, a base surface, a grid resolution, one or more gradient layers, and a different layer position for each of the gradient layers. In some embodiments, each base surface defines any two-dimensional (2D) region of space in any technically feasible fashion. In the same or other embodiments, each base surface can be any 2D surface that is aligned to a 2D plane (e.g., an xy-plane) in any technically feasible fashion. For instance, in some embodiments, the GUI engine 132 unfolds a target portion of a surface of a target 3D CAD model onto a 2D plane to generate a base surface. In the same or other embodiments, the grid resolution specifies a resolution for an overall grid of 2D points that is associated with the base surface. 2D points in a grid are also referred to herein as "2D grid points." A base surface is also referred to herein as an "overall surface."

In some embodiments, each layer position specifies the location of a different gradient layer, where each gradient layer is associated with one or more target 3D curvatures. In the same or other embodiments, the gradient layers are associated with an ordering. As described in greater detail below in conjunction with FIG. 2, in some embodiments, to apply a gradient specification to any set of points, the gradient engine 170 sequentially applies the gradient layers to the set of points as per the associated order.

In some embodiments, each gradient layer includes, without limitation, a layer base surface, any number of border sets, a border set type, a distribution type, a spread, a lift, optionally an influence distribution curve, and optionally an interaction type. In the same or other embodiments, a layer base surface is a planar surface that can be interactively positioned relative to a base surface via the GUI 140. In some embodiments, the position of each gradient layer included in a gradient specification is specified via a corresponding layer position included in the gradient specification.

In some embodiments, each border set includes, without limitation, one or more borders. Borders are also referred to herein as "borders of influence." In the same or other embodiments, a border includes, without limitation, any number and/or types of points and/or any number and/or types of curves that are defined in any technically feasible fashion. A border that includes a single point and no curves is also referred to herein as a "point border." A point that defines, at least in part, the structure of any number and/or types of other geometric elements (e.g., an edge, a line, a polygon) is also referred to herein as a "vertex." A curve can include, without limitation, any number and/or types of curve segments associated with any number and/or types of curvatures (including none). Some examples of curves are lines, Bezier curves, and Non-Uniform Rational B-Spline (NURBS) curves.

In some embodiments, a border set type, a distribution type, a spread, a lift, an influence distribution curve, and an interaction type are values for a border set type parameter, a distribution type parameter, a spread parameter, a lift parameter, an influence distribution curve parameter, and an interaction type parameter, respectively. In the same or other embodiments, each of a border set type, a distribution type, a spread, a lift, an influence distribution curve, an interaction type, or any combination thereof included in a gradient layer are associated with or "shared by" by each border set included in the gradient layer.

In the same or other embodiments, each gradient layer can specify, without limitation, values for any number and/or types of parameters instead of or in addition to values for the border set type parameter, the distribution type parameter, the spread parameter, the lift parameter, the influence distribution curve parameter, the interaction type parameter or any combination thereof. In some embodiments, each value of a parameter or "parameter value" that is included in a gradient layer can be associated with any number of the border sets included in the gradient layer in any technically feasible fashion.

In some embodiments, a border set type specifies, without limitation, any number and/or types of characteristics of one or more associated border sets in any technically feasible fashion. In the same or other embodiments, the border set type specifies one of any number of available border set types. As described in greater detail below, in some embodiments, two examples of available border set types are closed curve and patch.

In some embodiments, for each associated border set, a distribution type specifies any number and/or types of influences that the border set can exert on points in an associated layer base surface to displace the points along a z-axis (a third dimension). A distribution type can describe, in any technically feasible fashion, any number of influences directly and/or any number of influences indirectly. For instance, in some embodiments, the distribution type is one of any number of available distribution types that each represent a different set of one or more parameterized influences.

In some embodiments, each border set type is associated with a different set of available distribution types. In the same or other embodiments, a distribution type of curve indicates that an influence distribution curve specifies a degree of influence of a border set on a point as a function of any independent variable that can be computed based, at least in part, on a 2D position of a point.

In some embodiments, for each associated border set, a spread specifies a limit that is associated with the influence of at least one of the borders included in the border set. For example, a spread of 5 millimeters could indicate that a border does not influence (e.g., displace) any points that are located more than 5 millimeters from the border. In the same or other embodiments, for each associated border set, a lift specifies either a negative value that corresponds to a maximum inward displacement or a positive value that corresponds to a maximum outward displacement.

In some embodiments, an interaction type included in a gradient layer specifies how the influence of the gradient layer modifies displacement values along a z-axis that are attributable to the influence of one or more preceding gradient layers. For explanatory purposes, displacement values along the z-axis are also referred to herein as "z displacement values," "depth displacement values," and "depth values." An interaction type can specify how the influence of an associated gradient layer modifies existing z displacement values in any technically feasible fashion.

As descried in greater detail below in conjunction with FIG. 2, in some embodiments, the interaction type for each layer is a mathematical function. In the same or other embodiments, a default interaction type is "sum," indicating that a z displacement value corresponding to the influence of an associated gradient layer on a given 2D point is summed with a z displacement value corresponding to the 2D point and any preceding gradient layers.

In some embodiments, the gradient engine 170 generates any number of displacement fields and/or any number and/or types of 3D CAD models based, at least in part, on any number and/or types of gradient specifications. In some embodiments, to process a gradient specification, the gradient engine 170 generates an initial version of a displacement field based on the associated base surface and the associated grid resolution. A displacement field corresponding to a base surface is also referred to herein as an "overall displacement field." In some embodiments, a displacement field includes, without limitation, a different z displacement value for each point in a grid of 2D points. In the same or other embodiments, the gradient engine 170 initializes each z displacement value in an initial version of a displacement field to zero.

In some embodiments, the gradient engine 170 sequentially applies each gradient layer included in a gradient specification to the initial version of the displacement field to generate a final version of the displacement field. In the same or other embodiments, each z displacement value included in the final version of the displacement field can be positive, negative, or zero corresponding to an outward displacement, an inward displacement, or no displacement, respectively.

In some embodiments, the gradient engine 170 generates a 3D object design based, at least in part, on the final version of the displacement field. In the same or other embodiments, the gradient engine 170 or another CAD tool generates a 3D CAD model that represents the 3D object design in any technically feasible fashion. In some embodiments, the gradient engine 170 can generate a 3D CAD model representing a 3D object design in any technically feasible fashion that is based, at least in part, on the final version of the displacement field. The gradient engine 170 is described in greater detail below in conjunction with FIG. 2.

For explanatory purposes, some functionalities of the gradient modeling application 130, the GUI engine 132, and the gradient engine 170 are described in FIG. 1 in the context of an exemplary series of high-level events. During the exemplary series of high-level events, the GUI engine 132 generates a gradient specification 150(1). The gradient engine 170 generates a 3D CAD model 180(1) based on the gradient specification 150(1). The GUI engine 132 displays the 3D CAD model 180(1) via the GUI 140. The gradient modeling application 130 modifies the gradient specification 150(1) based on user events received via the GUI 140 to generate a gradient specification 150(2). The gradient engine 170 generates a 3D CAD model 180(2) based on the gradient specification 150(2). And the GUI engine 132 displays the 3D CAD model 180(2) via the GUI 140.

As persons skilled in the art will recognize, however, the techniques described herein in conjunction with the exemplary series of high-level events, the GUI 140, the gradient specification 150(1), the gradient specification 150(2), the 3D CAD model 180(1), and the 3D CAD model 180(2) are illustrative rather than restrictive and can be altered without departing from the broader spirit and scope of the invention. Many modifications and variations on the functionality of the gradient modeling application 130, the GUI engine 132, and the gradient engine 170 as described herein will be apparent to those of ordinary skill in the art without departing from the scope and spirit of the described embodiments. For instance, the techniques described herein can be be modified and applied to displace points in any number and/or types of surfaces based on any number and/or types of borders and one or more parameters that can vary the influence of the borders on the points.

Although not shown, in some embodiments, each gradient layer can optionally specify, without limitation, a parameterized mask instead of or in addition to values for any number and/or types of parameters. In the same or other embodiments, a parameterized mask for a gradient layer includes, without limitation, any number and/or types of values for any number and/or types of parameters that cause the gradient engine 170 to limit the influence of the gradient layer on 2D points. For instance, in some embodiments, a parameterized mask can specify, without limitation, a mask curve, a mask spread, and a distance option. In some embodiments, the mask spread specifies a limit to the influence of the parameterized mask. In the same or other embodiments, the distance option indicates whether a degree of influence of the parameterized mask on a 2D point that lies within the mask spread of the mask curve is proportional to or inversely proportional to the distance between the mask curve and the 2D point. In some embodiments, to apply a gradient layer that includes a parameterized mask to a displacement field, the gradient engine 170 modifies the displacement field based on any number and/or types of parameter values specified in the gradient layer. The gradient engine 170 modifies the resulting displacement field based on the parameterized mask to generate a new version of the displacement field that reflects the influence of the gradient layer.

The exemplary series of high-level events is depicted via numbered circles 1-9. For explanatory purposes, prior to the exemplary sequence of events, the GUI engine 132 generates and displays a sketch pane 142 within the GUI 140. As depicted via the circle numbered 1, a base surface 152 and a border set 148(1)-a border set 148(10) are interactively specified via the GUI 140. Although not shown in the sketch pane 142, the base surface 152 includes, without limitation, six relatively small circular openings and three relatively large oval openings.

As depicted within the sketch pane 142, each of the border set 148(1)-the border set 148(6) includes, without limitation, an "outer" curve that surrounds an "inner" curve that, in turn, surrounds a different one of the small circular openings in the base surface 152. By contrast, each of the border set 148(7)-the border set 148(9) includes, without limitation, a single curve that surrounds a different one of the large oval openings in the base surface 152. The border set 148(10) includes, without limitation, a single curve that surrounds both the border set 148(5) and the border set 148(6).

Although not depicted via the sketch pane 142, a gradient layer 160(1)-a gradient layer 160(5) are interactively specified via the GUI 140. For explanatory purposes, the border set 148(1)-the border set 148(4) are included in the gradient layer 160(1) denoted herein as "corners" The border set 148(5) and the border set 148(6) are included in the gradient layer 160(2). The border set 148(7) is included in the gradient layer 160(3). The border set 148(8) and the border set 148(9) are included in the gradient layer 160(4). And the border set 148(10) is included in the gradient layer 160(5).

In some embodiments, each of the gradient layer 160(1)-the gradient layer 160(5) includes, without limitation, a different set of parameter values. In the same or other embodiments, each set of parameter values specifies, without limitation, a border set type, a distribution type, a spread, a lift, a interaction type of sum, and optionally an influence distribution curve. In some embodiments, the set of parameter values included in a gradient layer is associated with each border set included in the gradient layer.

As depicted via the circle numbered 2, in response to one or more user events received via the GUI 140, the GUI engine 132 displays a scrollable list 144(1) that enables parameter values for the gradient layer 160(1)-the gradient layer 160(5) to be specified, viewed, and interactively modified. As shown, at the point-in-time corresponding to the circle numbered 2, the scrollable list 144(1) depicts a distribution type of outer and a lift of −5 mm for the gradient layer 160(1) denoted as corners. The GUI engine 132, the gradient modelling application 130, the gradient engine 170, or any combination thereof can perform any number and/or types of operations in response to any number and/or types of user events received via the scrollable list 144(1) and/or any number and/or types of other interactive GUI elements.

For instance, in some embodiments, in response to a selection of a border set type via the scrollable list 144(1), the GUI engine 132 automatically updates the scrollable list 144(1) to prompt for a selection of a distribution type from a set of available distribution types that is associated with the selected border set type. In the same or other embodiments, in response to a selection of a distribution type of curve via the scrollable list 144(1), the GUI engine 132 and/or the gradient modeling application 130 perform any number and/or types of operations to acquire, identify, or generate an associated influence distribution curve in any technically feasible fashion. For instance, in some embodiments, the gradient engine 170 automatically sets an associated influence distribution curve equal to a default influence distribution curve. In the same or other embodiments, the GUI engine 132 automatically displays one or more GUI elements that prompt for and/or enable specification of a non-default influence distribution curve.

As depicted via the circle numbered 3, the GUI engine 132 generates the gradient specification 150(1) that reflects any amount and/or types of user input received via the sketch pane 142, the scrollable list 144(1), any number and/or types of other interactive GUI elements, or any combination thereof. The gradient specification 150(1) includes, without limitation, the gradient layer 160(1)-the gradient layer 160(5), a layer position 156(1)-a layer position 156(5), the base surface 152, and a grid resolution 154. The layer position 156(1)-the layer position 156(5) specify the positions of the gradient layer 160(1)-160(5), respectively, within the base surface 152. The grid resolution 154 defines a default resolution for a displacement field corresponding to the base surface 152.

In some embodiments, the GUI engine 132 can display within the GUI 140, any number and/or types of interactive GUI elements that enable a user to specify any number and/or types of resolutions that override the grid resolution 154 for one or more associated operations. For instance, in some embodiments, the GUI engine 132 displays an interactive GUI element that enables a user to specify a target resolution that the gradient engine 170 takes into account when generating 3D object designs and/or 3D CAD models representing the 3D object designs.

For explanatory purposes, at the point-in-time corresponding to the circle numbered 3, the gradient layer 160(1) and the gradient layer 160(2) each specifies, without limitation, a border set type of patch, a distribution type of outer, a spread of 5 mm, and a lift of −5 mm. The gradient layer 160(3) and the gradient layer 160(40 each specifies, without limitation, a border set type of closed curve, a distribution type of curve, a spread of 8 mm, a lift of 8 mm, and a influence distribution curve that is equal to a default influence distribution curve. The gradient layer 160(5) specifies, without limitation, a border set type of closed curve, a distribution type of outer, a spread of 10 mm, and a lift of 10 mm.

As depicted via a circle numbered 4, the gradient engine 170 generates the 3D CAD model 180(1) representing a 3D object design based on the gradient specification 150(1). In some embodiments, to generate the 3D CAD model 180(1), the gradient engine 170 generates an initial version of a displacement field based on the base surface 152 and the grid resolution 154. The gradient engine 170 initializes each z displacement value in the initial version of a displacement field to zero.

The gradient engine 170 applies the gradient layer 160(1) to the initial version of the displacement field in accordance with the layer position 156(1) to generate a second version of the displacement field. The gradient engine 170 then applies the gradient layer 160(2) to the second version of the displacement field in accordance with the layer position 156(2) to generate a third version of the displacement filed. And the gradient engine 170 applies the gradient layer 160(3) to the third version of the displacement field in accordance with the layer position 156(3) to generate a fourth version of the displacement field. Subsequently, the gradient engine 170 applies the gradient layer 160(4) to the fourth version of the displacement field in accordance with the layer position 156(4) to generate a fifth version of the displacement field. The gradient engine 170 then applies the gradient layer 160(5) to the fifth version of the displacement field in accordance with the layer position 156(5) to generate a final version of the displacement field.

The gradient engine 170 can apply a gradient layer to a displacement field in any technically feasible fashion that is consistent with each border set and the parameter values specified in the gradient layer. In some embodiments, to apply a gradient layer to a displacement field, the gradient engine 170 sequentially, concurrently, or in any combination thereof, applies each border set included in the gradient layer to each 2D point in a subset of the displacement field that corresponds to a layer base surface specified in the gradient layer. The gradient engine 170 can apply a border set included in a gradient layer to a 2D point in a displacement field in any technically feasible fashion.

In some embodiments, to apply a border set included in a gradient layer to a 2D point in a displacement field, the gradient engine 170 determines a layer-specific z displacement value that describes an influence of the border set on the 2D point. The gradient engine 170 modifies the z displacement value for the 2D point that is included in the displacement field based on the layer-specific z displacement value and the interaction type associated with the gradient layer.

The gradient engine 170 can determine a layer-specific z displacement value that describes an influence of a border set on a 2D point in any technically feasible fashion that is consistent with the border set and the associated parameter values. For instance, in some embodiments, the gradient engine 170 determines the layer-specific displacement value based on the position of the 2D point relative to one or more borders included in the border set and one or more of the border set type, the distribution type, the spread, the lift, and optionally the influence distribution curve specified in the associated gradient layer.

As described previously herein, the gradient layer 160(1) and the gradient layer 160(2) and therefore the border set 148(1)-the border set 148(6) are associated with a border set type of patch. For explanatory purposes, a border set that is associated with a border set type of patch is also referred to herein as a "patch border set." In some embodiments, a patch border set includes, without limitation, two borders that define a 2D "patch" of the associated layer base surface that lies between the two borders, and is inclusive of the two borders. Each of the borders included in a patch border set can be any type of curve. In the same or other embodiments, a patch border set can be associated with a distribution type of inner, outer, or curve In some embodiments, the gradient engine 170 determines a layer-specific displacement value corresponding to a 2D point and a patch border set based, at least in part, on whether the 2D point lies in a maximum influence region, a no influence region, or a distribution region relative to the associated patch. If the 2D point lies inside the associated patch and at least the associated spread from the perimeter of the associated patch, then the 2D point lies in the maximum influence region, and the gradient engine 170 sets the layer-specific displacement value equal to the associated lift. If, however, the 2D point lies outside the associated patch and at least the associated spread from the perimeter of the associated patch, then the 2D point lies in the no influence region, and the gradient engine 170 sets the layer-specific displacement value equal to zero.

If, however, the 2D point lies less than the associated spread from the perimeter of the associated patch, then the 2D point lies in the distribution region, and the gradient engine 170 determines the layer-specific displacement value based on the associated distribution type. More specifically, if the associated distribution type is inner and the 2D point lies in a portion of the distribution region that does not overlap with the associated patch, then the gradient engine 170 sets the layer-specific displacement value equal to zero.

If, however, the associated distribution type is inner and the 2D point lies in a portion of the distribution region that overlaps with the associated patch, then the gradient engine 170 sets the layer-specific displacement value equal to (lift*perDist/spread), where lift denotes the associated lift, perDist denotes an associated perimeter distance, and spread denotes the associated spread. In some embodiments, a perimeter distance that is associated with both a 2D point and a patch border set is equal to a minimum absolute 2D distance between the 2D point and the perimeter of the associated patch.

By contrast, if the associated distribution type is outer and the 2D point lies in a portion of the distribution region that overlaps with the associated patch, then the gradient engine 170 sets the layer-specific displacement value equal to the associated lift. If, however, the associated distribution type is outer and the 2D point lies in a portion of the distribution region that does not overlap with the associated patch, then the gradient engine 170 sets the layer-specific displacement value equal to (lift*(spread−perDist)/spread).

And if the associated distribution type is curve and the 2D point lies in the distribution region, then the gradient engine 170 computes the layer-specific displacement value based on an associated influence distribution curve. In the same or other embodiments, an influence distribution curve for a patch border set defines a degree of influence based on the perimeter distance. In some embodiments, the gradient engine 170 implements a default influence distribution curve specifying that a degree of influence is inversely proportional to the perimeter distance. In the same or other embodiments, to determine the layer-specific displacement value for a 2D point based on the default influence distribution curve, the gradient engine 170 sets the layer-specific displacement value equal to (lift*(spread−perDist)/spread).

As described previously herein, the gradient layer 160(3)-the gradient layer 160(5) and therefore the border set 148(7)-the border set 148(10) are associated with a border set type of closed curve. For explanatory purposes, a border set that is associated with a border set type of closed curve is also referred to herein as a "closed border set." In some embodiments, a closed border set includes, without limitation, a single border that can be any type of closed curve. In the same or other embodiments, a closed border set can be associated with a distribution type of inner, outer, or curve.

In some embodiments, the gradient engine 170 determines a layer-specific displacement value corresponding to a 2D point and a closed border set based, at least in part, on whether the 2D point lies in a maximum influence region, a no influence region, or a distribution region relative to the associated closed curve. If the 2D point lies at least the associated spread inside the closed curve, then the 2D point lies in the maximum influence region, and the gradient engine 170 sets the layer-specific displacement value equal to the associated lift. If, however, the 2D point lies at least the associated spread outside the associated closed curve, then the 2D point lies in the no influence region, and the gradient engine 170 sets the layer-specific displacement value equal to zero.

If the 2D point lies less than the associated spread from the associated closed curve, then the 2D point lies in the distribution region, and the gradient engine 170 determines the layer-specific displacement value based on the associated distribution type. More specifically, if the associated distribution type is inner and the 2D point lies in a portion of the distribution region that is outside the associated closed curve, then the gradient engine 170 sets the layer-specific displacement value equal to zero.

If, however, the associated distribution type is inner and the 2D point lies in a portion of the distribution region that is coincident to or inside the associated closed curve, then the gradient engine 170 sets the layer-specific displacement value equal to lift*closedDist/spread, where lift denotes the associated lift, closedDist denotes an associated closed distance, and spread denotes the associated spread. In some embodiments, a closed distance that is associated with both a 2D point and a closed border set is equal to a minimum absolute 2D distance between the 2D point and the associated closed curve.

By contrast, if the associated distribution type is outer and the 2D point lies in a portion of the distribution region that is coincident to or inside the associated closed curve, then the gradient engine 170 sets the layer-specific displacement value equal to the associated lift. If, however, the associated distribution type is outer and the 2D point lies in a portion of the distribution region that is outside the associated closed curve, then the gradient engine 170 sets the layer-specific displacement value equal to (lift*(spread−chkDist)/spread).

And if the associated distribution type is curve and the 2D point lies in the distribution region, then the gradient engine 170 computes the layer-specific displacement value based on the associated influence distribution curve. In the same or other embodiments, an influence distribution curve for a closed border set defines a degree of influence based on the closed distance. In some embodiments, the gradient engine 170 implements a default influence distribution curve specifying that a degree of influence is inversely proportional to the closed distance. In the same or other embodiments, to determine the layer-specific displacement value for a 2D point based on the default influence distribution curve, the gradient engine 170 sets the layer-specific displacement value equal to (lift*(spread−closedDist)/spread).

In some embodiments, the gradient engine 170 generates a 3D object design corresponding to the gradient specification 150(1) based, at least in part, on the final version of the displacement field As shown, in some embodiments, the gradient engine 170 generates the 3D CAD model 180(1) representing the 3D object design corresponding to the gradient specification 150(1).

As depicted via a circle numbered 5, the GUI engine 132 displays the 3D CAD model 180(1) in a CAD model pane 190(1) within the GUI 140. The 3D CAD model 180(1) reflects the parameter values described previously herein in conjunction with the circle numbered 3. As shown, points that lie inside or within 5 mm of the patches associated with the border set 148(1)-the border set 148(6) are displaced inwards by a maximum of 5 mm to reflect a distribution type of outer, a lift of −5 mm, and a spread of 5 mm.

Points that lie within 8 mm of the closed curves in the border set 148(7)-the border set 148(9) are displaced outwards by a maximum of 8 mm to reflect a distribution type of curve, a lift of 8 mm, and a spread of 8 mm. As depicted within the CAD model pane 190(1), the displaced points associated with the border set 148(7)-the border set 148(9) form flanges around each of the oval openings.

Points that lie inside or within 10 mm of the closed curve in the border set 148(10) are incrementally displaced outwards by a maximum of 10 mm to reflect a distribution type of outer, a lift of 10 mm, and a spread of 10 mm. Because the closed curve in the border set 148(10) surrounds both the border set 148(5) and the border set 148(6), the displaced points associated with the border set 148(10) form a relatively high ridge around the two oval openings that are surrounded by the border set 148(5) and the border set 148(6).

As depicted via the circle numbered 6, in response to one or more user events received via the GUI 140, the GUI engine 132 modifies the scrollable list 144(1) to generate a scrollable list 144(2). Subsequently, the GUI engine 132 displays the scrollable list 144(2) instead of the scrollable list 144(1) within the GUI 140. For explanatory purposes, the only difference between the scrollable list 144(2) and the scrollable list 144(1) is that the scrollable list 144(2) specifies a lift of 10 mm instead of −5 mm for the gradient layer 160(1) denoted as corners.

As depicted via a circle numbered 7, the GUI engine 132 automatically modifies the gradient specification 150(1) to generate the gradient specification 150(2) that reflects the change of the lift specified in the gradient layer 160(1) from −5 mm to 10 mm. The remainder of the gradient specification 150(2) matches the gradient specification 150(1).

As depicted via a circle numbered 8, the gradient engine 170 generates a 3D object design corresponding to the gradient specification 150(2) and the 3D CAD model 180(2) representing the 3D object design corresponding to the gradient specification 150(2). As depicted via a circle numbered 9, the GUI engine 132 displays the 3D CAD model 180(2) in a CAD model pane 190(2) within the GUI 140. As shown, the four corners of the 3D CAD model 180(2) are displaced 15 mm outwards relative to the four corners of the 3D CAD model 180(1).

In some embodiments, the gradient modeling application 130 can write any amount and/or types of data to and/or read any amount and/or types of data from any number and/or types of memory. For instance, in some embodiments, the gradient modeling application 130 stores any portions (including all) of each of any number gradient specifications, any number of displacement fields, any number of 3D CAD models, or any combination thereof in a CAD database 106 that resides in the memory 116. In the same or other embodiments, the gradient modeling application 130 can store any amount and/or types of data in any number and/or types of memories and/or storage in any technically feasible fashion.

In some embodiments, the gradient modeling application 130 can transmit any amount and/or types of data to any number and/or types of software applications. For instance, in some embodiments, the gradient modeling application 130 can transmit any amount and/or types of data to a CAD tool 108 that resides in the memory 116, any number of other software application that reside in the memory 116, any number of other software applications that reside in any number of other memories, or any combination thereof. In some embodiments, the gradient modeling application 130 can cause the CAD tool 108, any number of other software application that reside in the memory 116, any number of other software application that reside in any number of other memories, or any combination thereof to perform any number and/or types of tasks in any technically feasible fashion.

Note that the techniques described herein are illustrative rather than restrictive and can be altered without departing from the broader spirit and scope of the invention. Many modifications and variations on the functionality of the gradient modeling application 130, the GUI engine 132, and the gradient engine 170 as described herein will be apparent to those of ordinary skill in the art without departing from the scope and spirit of the described embodiments. Similarly, many modifications and variations on the content of the gradient specifications as described herein will be apparent to those of ordinary skill in the art without departing from the scope and spirit of the described embodiments.

It will be appreciated that the system 100 shown herein is illustrative and that variations and modifications are possible. For example, the functionality provided by the gradient modeling application 130, the GUI engine 132, and the gradient engine 170 as described herein can be integrated into or distributed across any number of software applications (including one), and any number of components of the system 100. Further, the connection topology between the various units in FIG. 1 can be modified as desired.

Figure 2:
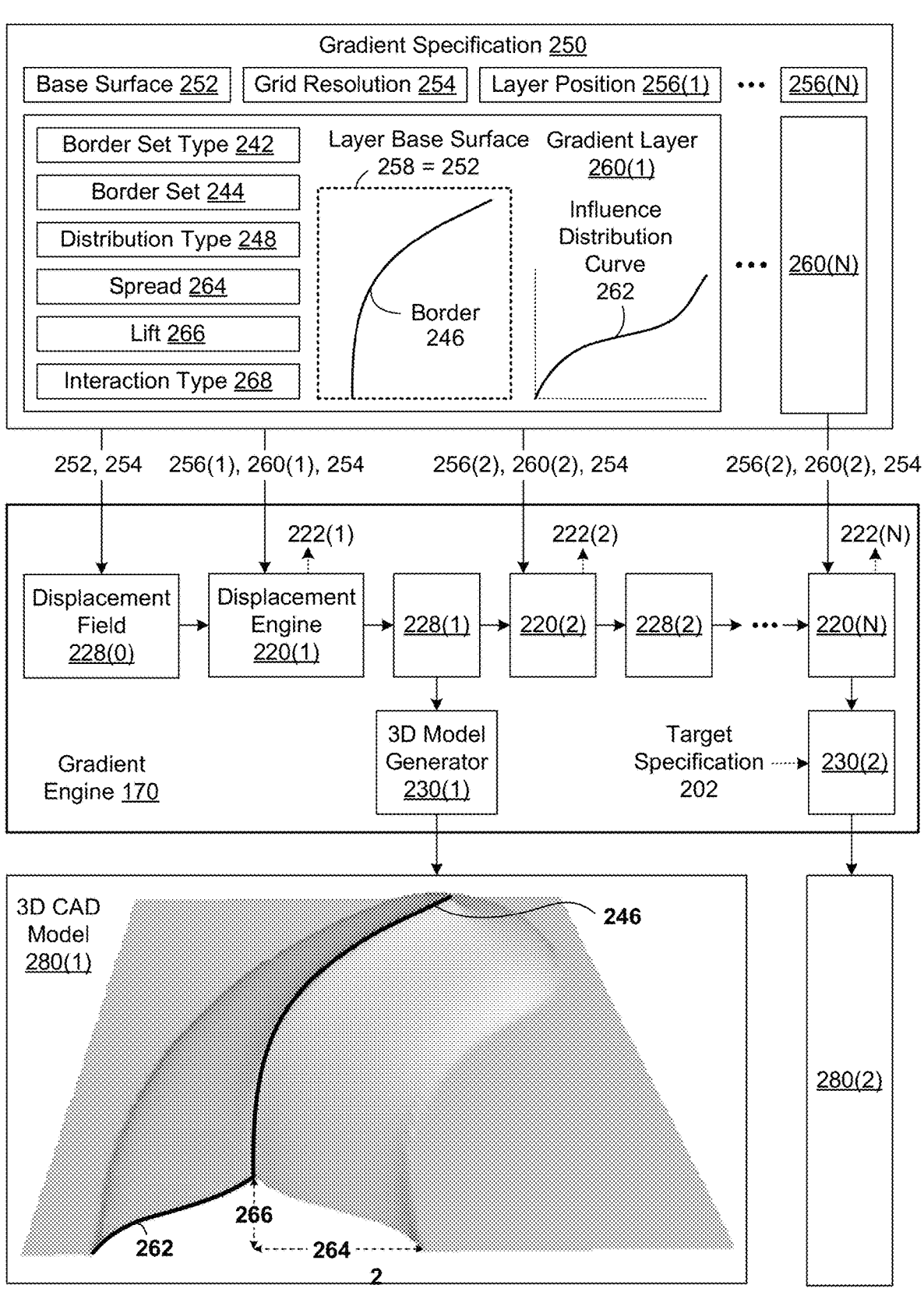
FIG. 2 is a more detailed illustration of the gradient engine of FIG. 1, according to various embodiments.

FIG. 2 is a more detailed illustration of the gradient engine 170 of FIG. 1, according to various embodiments. As described previously herein in conjunction with FIG. 1, in some embodiments, the gradient engine 170 generates 3D CAD models representing 3D object designs based, at least in part, on gradient specifications. In some embodiments, including some embodiments depicted in and described in conjunction with FIG. 2, the gradient engine 170 generates a 3D CAD model 280(1) and a 3D CAD model 280(2) based on a gradient specification 250.

In some other embodiments, instead of or in addition to generating one or more 3D CAD models, the gradient engine 170 generates any number of displacement fields and/or any number of displacement maps. Although not shown in FIG. 2, in some embodiments, the gradient engine 170 can read any amount and/or types of data from and/or write any amount and/or type of data to any number and/or types of memories (e.g., the CAD database 106). In the same or other embodiments, the gradient engine 170 can interact with any number of other software applications (e.g., the GUI engine 132, the CAD tool 108, any other CAD tools) to perform any number and/or types of operations that are associated with the gradient specification 250, any number of displacement fields, any number of displacement maps, any number of 3D CAD models, or any combination thereof in any technically feasible fashion.

As shown, in some embodiments, the gradient specification 250 includes, without limitation, a base surface 252, a grid resolution 254, a layer position 256(1)-a layer position 256(N), and a gradient layer 260(1)-a gradient layer 260(N), where N can be any positive integer (including 1). The gradient specification 250, the base surface 252, the grid resolution 254, the layer position 256(1)-the layer position 256(N), and the gradient layer 260(1)-the gradient layer 260(N) are specific instances or examples of a gradient specification, a base surface, a grid resolution, layer positions, and gradient layers, respectively, described previously herein in conjunction with FIG. 1.

In some embodiments, the base surface 252 defines any 2D region of space in any technically feasible fashion. In the same or other embodiments, the base surface 252 can be any 2D surface that is aligned to any 2D plane (e.g., an xy-plane) in any technically feasible fashion. In some embodiments, the base surface 252 is a bounding box or a perimeter. The grid resolution 254 specifies a resolution for an overall grid associated with the base surface 252. The layer position 256(1)-the layer position 256(N) specify positions of the gradient layer 260(1)-the gradient layer 260(N), respectively, within the base surface 252.

As described in greater detail below, in some embodiments, the gradient engine 170 successively applies the gradient layer 260(1)-the gradient layer 260(N) to the base surface 252 in accordance with the grid resolution 254 to determine depth displacements that are attributable to the influence of the gradient specification 250 on the base surface 252. In some embodiments, each depth displacement corresponds to a displacement along a z-axis and is therefore a z displacement value.

In some embodiments, each gradient layer includes, without limitation, a layer base surface, a border set type, any number of border sets, a distribution type, a spread, a lift, optionally an influence distribution curve, and optionally an interaction type. In the same or other embodiments, each border set includes, without limitation, one or more borders. For explanatory purposes, the functionality of the gradient engine 170 is depicted and described in detail in FIG. 2 with respect to the gradient layer 260(1).

As shown, in some embodiments, the gradient layer 260(1) includes, without limitation, a layer base surface 258, a border set type 242, a border set 244, a distribution type 248, an influence distribution curve 262, a spread 264, a lift 266, and an interaction type 268. In the same or other embodiments, the border set 244 is associated with the border set type 242, the distribution type 248, the influence distribution curve 262, the spread 264, the lift 266, and the interaction type 268.

Figure 3:
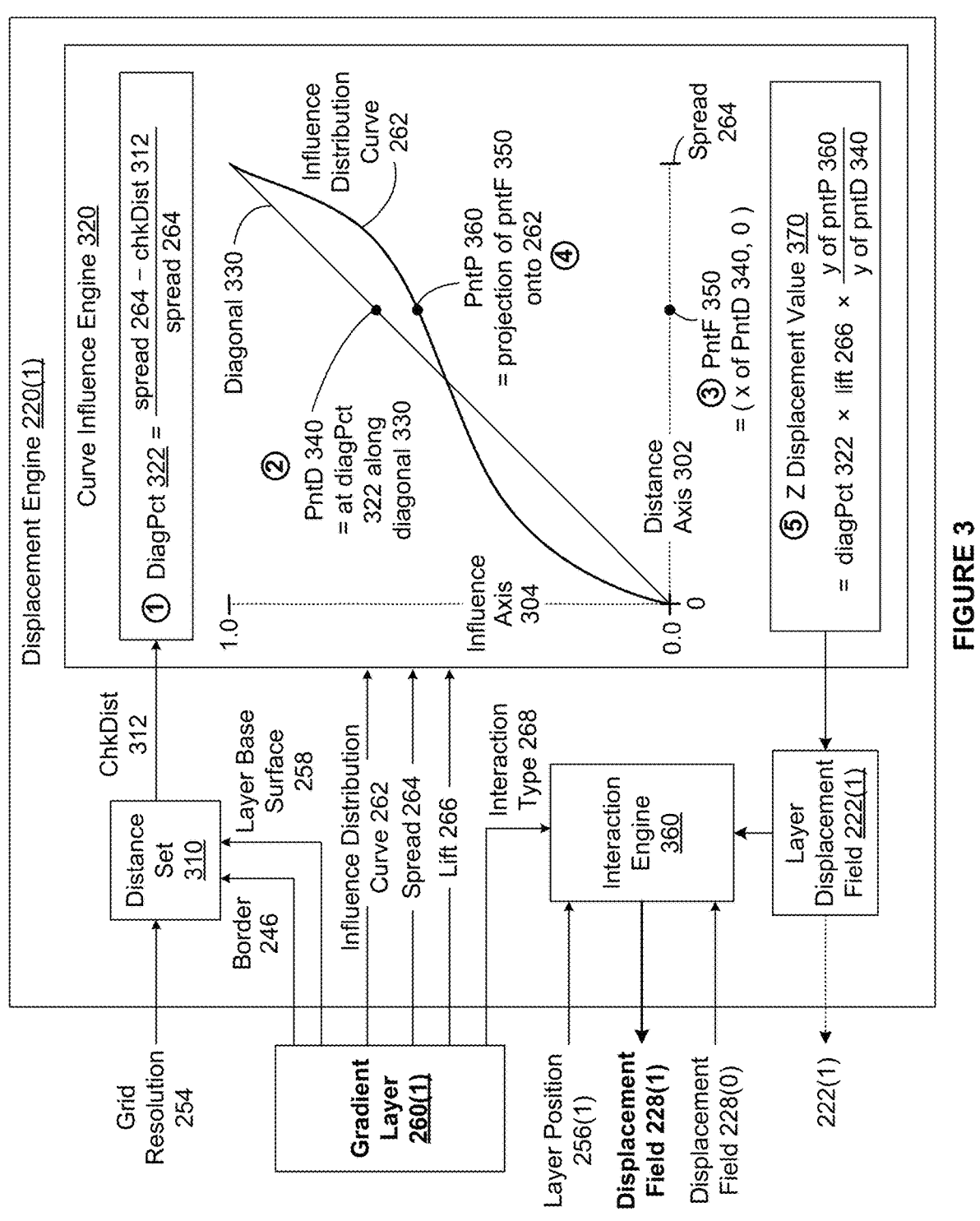
FIG. 3 is a more detailed illustration of the displacement engine of FIG. 2, according to various embodiments.

In some embodiments, the gradient layer 260(1) can include, without limitation, any number of other border sets in addition to the border set 244 and the techniques described in conjunction with FIG. 2 and FIG. 3 are modified accordingly. For instance, in some embodiments each border set that is included in the gradient layer 260(1) is associated with the border set type 242, the distribution type 248, the influence distribution curve 262, the spread 264, the lift 266, and the interaction type 268.

In some embodiments, the gradient layer 260(1) can include, without limitation, any number and/or types of parameter values instead of or in addition to the border set type 242, the distribution type 248, the influence distribution curve 262, the spread 264, the lift 266, the interaction type 268, or any combination thereof. For instance, in some embodiments, the gradient layer 260(1) omits the interaction type 268 and the gradient engine 170 implements a default interaction type for the gradient layer 260(1).

In some embodiments, the layer base surface 258 is a planar surface that is positioned relative to the base surface 252 as per the layer position 256(1). The layer base surface 258 can be specified in any technically feasible fashion. In some other embodiments, the layer base surface 258 is a planar surface or an unwrapped surface of an existing 3D object design. In some other embodiments, the layer base surface 258 is specified via a bounding box or a 2D perimeter corresponding to any type of object, surface, or other 2D region. In some embodiments, including some embodiments depicted in FIG. 2, the layer base surface 258 is equal to the base surface 252.

In some embodiments, the border set type 242 specifies any number and/or types of characteristics of the border set 244 in any technically feasible fashion. In some embodiments, the border set type 242 specifies one of any number of available border set types, where each available border set type is associated with a different set of characteristics. As described previously herein in conjunction with FIG. 1, in some embodiments, two examples of available border set types are closed curve and patch.

For explanatory purposes, the border set type 242 is single curve. In some embodiments, a border set that is associated with a border set type of single curve includes, without limitation, a single border that can be any type of curve. In accordance with the border set type 242 of single curve, in some embodiments, the border set 244 is a one-element set that includes, without limitation, a border 246 that is a curve. For explanatory purposes, the border 246 is depicted within the layer base surface 258.

In some embodiments, the distribution type 248 specifies any number and/or types of influences that the border set 244 can exert on points in the layer base surface 258 to displace the points along a z-axis. For explanatory purposes, the distribution type 248 is curve. In accordance with the distribution type 248 of curve, in some embodiments, the influence distribution curve 262 specifies a degree of influence of the border set 244 on a point as a function of any independent variable that can be computed based, at least in part, on a 2D position of a point.

For explanatory purposes, FIG. 2 depicts an exemplary graph of the influence distribution curve 262. The horizontal axis of the exemplary graph corresponds to a minimum absolute 2D distance between a point in the layer base surface 258 and the border 246. The vertical axis of the exemplary graph corresponds to a fraction of influence from 0.0 to 1.0, where 0.0 corresponds to no influence and 1.0 corresponds to a maximum influence. The influence distribution curve 262 is described in greater detail below in conjunction with FIG. 3.

The spread 264 specifies a distance-related limit associated with the influence of the border set 244 in any technically feasible fashion. In some embodiments, the spread 264 specifies a maximum absolute 2D distance. In the same or other embodiments, if the minimum absolute 2D distance between a 2D point and the border 246 is greater than the spread 264, then the border set 244 has no influence on a z displacement value associated with the 2D point.

In some embodiments, the lift 266 specifies a maximum influence that the border set 244 can have on a point in any technically feasible fashion. In some embodiments, the lift 266 is a displacement limit. In the same or other embodiments, the lift 266 specifies either a negative value that corresponds to a maximum inward displacement or a positive value that corresponds to a maximum outward displacement.

In some embodiments, the interaction type 268 specifies an interaction type for the border set 244. An interaction type is also referred to herein as an "aggregation type" and a "blending mode." As described previously herein in conjunction with FIG. 1, in some embodiments, an interaction type included in a gradient layer specifies how the influence of the gradient layer modifies z displacement values that are attributable to the influence of one or more preceding gradient layers.

An interaction type can specify how the influence of an associated gradient layer modifies existing z displacement values in any technically feasible fashion. In some embodiments, each interaction type is a mathematical function. In the same or other embodiments, some examples of available interaction types include, without limitation, sum, difference, minimum, maximum, and average. In some embodiments, including some embodiments depicted and described in conjunction with FIG. 2, the interaction type of the first gradient layer included in a gradient specification determines how the first gradient layer modifies initial z displacement values of 0 For explanatory purposes, because the gradient layer 260(1) is the first layer included in the gradient specification 250, the interaction type 268 is irrelevant.

In some embodiments, if an interaction type is not specified for a gradient layer, then the gradient modeling application 130, the GUI engine 132, or the gradient engine 170 sets the interaction type equal to a default interaction type. In the same or other embodiments embodiments, the default interaction type is sum. In some embodiments, if a gradient layer is associated with an interaction type of sum, then the gradient engine 170 sums a z displacement value corresponding to the influence of the gradient layer on a given 2D point with a z displacement value corresponding to the 2D point and any preceding gradient layers.

As shown, in some embodiments, the gradient engine 170 generates the 3D CAD model 280(1) and the 3D CAD model 280(2) based on the gradient specification 250. To generate the 3D CAD model 280(1), the gradient engine 170 applies the gradient layer 260(1) to the base surface 252. To generate the 3D CAD model 280(2), the gradient engine 170 successively applies the gradient layer 260(1)-the gradient layer 260(N) to the base surface 252. In some other embodiments, the gradient engine 170 can generate any number and/or types of 3D CAD models that correspond to any number of other subsets of the gradient layer 260(1)-the gradient layer 260(N).

As shown, in some embodiments, the gradient engine 170 includes, without limitation, a displacement field 228(0)-a displacement field 228(N), a displacement engine 220(1)-a displacement engine 220(N), a 3D model generator 230(1), and a 3D model generator 230(2), where N is the total number of gradient layers included in the gradient specification 250.

In some embodiments, the displacement field 228(0) includes, without limitation, a different z displacement value for each 2D point included in an overall grid (not shown) associated with the base surface 252. In the same or other embodiments, the resolution of the overall grid is equal to the grid resolution 254. The gradient engine 170 can determine the overall grid and generate the displacement field 228(0) in any technically feasible fashion.

As shown, in some embodiments, the gradient engine 170 determines the overall grid based on the base surface 252 and the grid resolution 254. In some embodiments, the gradient engine 170 samples the base surface 252 based on the grid resolution 254 to determine the overall grid. In some other embodiments, the gradient engine 170 subdivides a bounding box or a perimeter associated with the base surface 252 based on the grid resolution 254 to determine the overall grid. The gradient engine 170 can determine the z displacement values included in the displacement field 228(0) in any technically feasible fashion. In some embodiments, the gradient engine 170 sets each of the z displacement values included in the displacement field 228(0) equal to zero.

In some embodiments, the gradient engine 170 selects the displacement engine 220(1) from any number and/or types of available displacement engines based on the border set type 242 and the distribution type 248. In the same or other embodiments, each available displacement engine modifies the z displacement values specified in an input displacement field based on a gradient layer to generate an output displacement field and optionally a layer displacement field. Accordingly, the input displacement field and the output displacement field specify, without limitation, different sets of z displacement values for the same set of 2D points.

In some embodiments, one or more of the available displacement engines optionally generates and outputs a layer displacement field for a gradient layer. In the same or other embodiments, a layer displacement field for a gradient layer specifies a different displacement value for each 2D point included in a layer grid (not shown) that is associated with the gradient layer. In the same or other embodiments, the resolution of the layer grid is equal to the grid resolution 254, and the layer grid is a portion of the overall grid that is translated from the frame of reference of the base surface 252 into the frame of reference of the layer base surface specified in the associated gradient layer.

For explanatory purposes, the gradient engine 170 selects displacement engine 220(1) based on the border set type 242 of single curve and the distribution type 248 of curve. As shown, in some embodiments, the gradient engine 170 inputs the displacement field 228(0), the gradient layer 160(1), the layer position 256(1), and the grid resolution 254 into the displacement engine 220(1). In response, the displacement engine 220(1) generates and outputs the displacement field 228(1) and optionally a layer displacement field 222(1) that is associated with the gradient layer 160(1). The displacement engine 220(1) in some embodiments is described in greater detail below in conjunction with FIG. 3.

In some embodiments, the 3D model generator 230(1) and the 3D model generator 230(2) are different instances of a single 3D model generator that can generate any number and/types of 3D CAD models based on any number and/or types of displacement fields and optionally any number and/or types of target specifications. In some embodiments, a target specification can describe any amount and/or type of data relevant to generating a 3D CAD model based, at least in part, on a displacement field or data derived from a displacement field. In some embodiments, each target specification can specify, without limitations, a target resolution, a target 3D CAD model type, one or more target surfaces of one or more 3D CAD models representing one or more 3D object designs, or any combination thereof.

In some embodiments, if no target surfaces are specified, then the 3D model generator uses the 2D points and corresponding z displacement values included in a displacement field to generate a 3D object design. In the same or other embodiments, the 3D model generator can execute any number and/or types of sampling operations, meshing operations, segmentation operations, conversion operations, any other operations, or any combination thereof on the 3D object design to generate any type of 3D CAD model that represents the 3D object design. In the same or other embodiments, the 3D model generator generates the 3D CAD model based, at least in part, on a target resolution. In some embodiments the 3D model generator can represent a 3D object design using a quad mesh, a T-Spline model, a NURBS model, a BRep, or any other type of 3D CAD model. In the same or other embodiments, the 3D model generator represents a 3D object design using a 3D CAD model having a target 3D CAD model type.

In some embodiments, if one or more target surfaces of one or more target 3D CAD models are specified, then the 3D model generator applies a displacement field to each of the target surfaces in any technically feasible fashion to generate a new 3D CAD model. In the same or other embodiments, to apply a displacement field to a target surface, the 3D model generator projects the displacement field onto the target surface using an appropriate projection type and then displaces the target surface as per the projected displacement field and optionally a target resolution. Some examples of projection types are planar, cylindrical, and spherical.

In some embodiments, based on the displacement field 228(1), the 3D model generator 230(1) generates a 3D object design and 3D CAD model 280(1) that represents the 3D object design. In the same or other embodiments, the 3D CAD model 280(1) represents a version of the base surface 252 that has been variably displaced along the z axis as per the displacement field 228(1). For explanatory purposes, the version of the base surface 252 that has been variably displaced along the z axis as per the displacement field 228(1) and is represented by the 3D CAD model 280(1) is also referred to herein as a "depth-displaced surface."

For explanatory purposes, FIG. 2 depicts an annotated version of the 3D CAD model 280(1), As shown, the portion of the depth-displaced surface that corresponds to the border 246 is displaced outward from an xy-plane by a distance that is equal to the lift 266 and therefore forms an outward edge. On each side of the outward edge, the outward displacement gradually and symmetrically decreases as the distance from the border 246 and therefore the outward edge increases from 0 to the spread 264. More specifically, the pattern of the outward displacement on each side of the outward edge reflects the influence distribution curve 262. Portions of the depth-displaced surface that are lie further than the spread 264 from the border 246 are not displaced and therefore are aligned to a 2D plane.

In some embodiments, for an integer j from 2-N, inclusive, the gradient engine 170 selects the displacement engine 220(j) based on the border set type and the distribution type that are included in the gradient layer 260(j). The gradient engine 170 inputs the displacement field 228(j-1), the gradient layer 160(j), the layer position 256(j), and the grid resolution 254 into the displacement engine 220(j). In response, the displacement engine 220(j) generates and outputs the displacement field 228(j) and optionally a layer displacement field 222(j) that is associated with the gradient layer 160(j).

In some embodiments, the 3D model generator 230(2) generates the 3D CAD model 280(2) based on the displacement field 228(N) and optionally a target specification 202. In the same or other embodiments, the target specification 202 configures the 3D model generator 230(2) to apply any number of instances of the displacement field 228(N) to any target portions (e.g., surfaces) of any number of target 3D CAD models in any technically feasible fashion.

Although not shown, in some embodiments, the gradient engine 170, generates one or more displacement maps (not shown) based on one or more of the displacement field 228(1)-displacement field 228(N) and/or one or more of the layer displacement field 222(1)-the layer displacement field 222(N). In some embodiments, each displacement map is a bitmap. In the same or other embodiments, each displacement map represents a corresponding displacement field or a corresponding layer displacement field as a grayscale image or color image, where the intensities or colors, respectively, of the pixels indicate z displacement values for corresponding 2D points.

In some embodiments, the gradient engine 170 can transmit any amount and/or types of data to any number of software applications in any technically feasible fashion. In the same or other embodiments, the gradient engine 170 can store any amount and/or types of data in any number and/or types of memories and/or storage. For instance, in some embodiments, the gradient engine 170 stores the 3D CAD model 280(1), the 3D CAD model 280(2), the displacement field 228(1)-the displacement field 228(N), the layer displacement field 222(1)-the layer displacement field 222(N), any number of displacement maps, or any combination thereof in the CAD database 106.

Advantageously, as illustrated by the 3D CAD model 280(1), the gradient modeling application 130 can be used to generate designs of complex curvilinear 3D shapes that are difficult to specify via a typical CAD tool. Furthermore, the gradient modeling application 130 and/or any number of other software applications can reuse any portions of gradient specifications, gradient layers, influence distribution curves, border sets, borders, displacement fields, layer displacement fields, displacement maps, or any combination thereof to generate any number of 3D object designs and/or any number of 3D CAD models representing 3D object designs, Furthermore, re-using portions of gradient specifications, gradient layers, influence distribution curves, border sets, borders, displacement fields, layer displacement fields, displacement maps, or any combination thereof can increase consistency across 3D object designs and can facilitate establsignature styles.

Computing Displacement Values Based on an Influence Distribution Curve

FIG. 3 is a more detailed illustration of the displacement engine 220(1) of FIG. 2, according to various embodiments. As described previously herein in conjunction with FIG. 2, in some embodiments, the displacement engine 220(1) is an example of a displacement engine that modifies z displacement values associated with 2D points in a base surface that is aligned to an xy-plane along a z-axis based on a gradient layer associated with a border set type of single curve and a distribution type of curve. More precisely, and referring back to FIG. 2, the displacement engine 220(1) modifies z displacement values included in displacement field 228(0) based on the gradient layer 260(1), the layer position 256(1), and the grid resolution 254 to generate the displacement field 228(1).

As described previously herein in conjunction with FIG. 2, in some embodiments, the displacement field 228(0) includes, without limitation, a different z displacement value for each 2D point included in an overall grid associated with the base surface 252. In the same or other embodiments, the resolution of the overall grid is equal to the grid resolution 254.

Referring back to FIG. 2, in some embodiments the gradient layer 260(1) includes, without limitation, the layer base surface 258, the border set type 242 of single curve, the border set 244, the distribution type 248 of curve, the influence distribution curve 262, the spread 264, the lift 266, and the interaction type 268. The border set 244 includes, without limitation, the border 246 that is a single curve. In some embodiments, the layer base surface 258 is a planar surface that is positioned relative to the base surface 252 as per the layer position 256(1). In the same or other embodiments, the border 246 and the influence distribution curve 262 are specified relative to the layer base surface 258.

As shown, in some embodiments, the displacement engine 220(1) includes, without limitation, a distance set 310, a curve influence engine 320, layer displacement field 222(1), and an interaction engine 380. In some embodiments, for each 2D point included in a layer grid (not shown) associated with the layer base surface 258, the distance set 310 specifies a distance between the border 246 and the 2D point. In the same or other embodiments, the resolution of the layer grid is equal to the grid resolution 254, and the layer grid is a portion of the overall grid that is translated from the frame of reference of the base surface 252 into the frame of reference of the layer base surface 258 as per the layer position 256(1). The displacement engine 220(1) can determine the layer grid and generate the distance set 310 in any technically feasible fashion.

As shown, in some embodiments, the displacement engine 220(1) generates the distance set 310 based on the border 246, the layer base surface 258, and the grid resolution 254. In the same or other embodiments, the displacement engine 220(1) determines the layer grid based on the layer base surface 258 and the grid resolution 254. To generate the distance set 310, the displacement engine 220(1) computes a minimum absolute 2D distance between each 2D point included in the layer grid and the border 246. The displacement engine 220(1) can compute the minimum absolute 2D distances in any technically feasible fashion.

As shown, in some embodiments, the curve influence engine 320 maps a distance between a 2D point and the border 246 to a z displacement value based on the influence distribution curve 262, the spread 264, and the lift 266. In some embodiments, including embodiments depicted in FIG. 3, the displacement engine 220(1) executes one or more instances of the curve influence engine 320 concurrently, sequentially, or in any combination thereof, to generate the layer displacement field 222(1) based on the distance set 310. In the same or other embodiments, the layer displacement field 222(1) includes, without limitation, a different z displacement value for each 2D point included in the layer grid.

For explanatory purposes, the functionality of the curve influence engine 320 in some embodiments is depicted and described in the context of computing a z displacement value 370 based on a check distance (chkDist) 312. During a span of time depicted in FIG. 3, the displacement engine 220(1) sets the chkDist 312 equal to a distance specified in the distance set 310 and corresponding to a specific 2D point. The curve influence engine 320 then computes the z displacement value 370 based on the chkDist 312, the influence distribution curve 262, the spread 264, and the lift 266. Subsequently, the displacement engine 220(1) stores the z displacement value 370 in the layer displacement field 222(1) as a z displacement value for the specific 2D point.

As described previously herein in conjunction with FIG. 2, in some embodiments, if the minimum absolute 2D distance between a 2D point and the border 246 is greater than the spread 264, then the border set 244 has no influence on a z displacement value of the 2D point. In the same or other embodiments, if chkDist 312 is greater than the spread 264, then the curve influence engine 320 sets the z displacement value 370 equal to zero. Otherwise, the curve influence engine 320 executes a series of computations to determine the z displacement value 370.

For explanatory purposes, FIG. 3 depicts an exemplary series of computations that the curve influence engine 320 performs to compute the z displacement value 370 when the chkDist 312 is less than or equal to the spread 264. The exemplary series of computations is depicted via numbered circles 1-5 and an exemplary graph of an exemplary instance of the influence distribution curve 262. As persons skilled in the art will recognize, the techniques described and depicted herein can be altered and applied to any type of influence distribution curve 262.

As shown, the horizontal axis of the exemplary graph is a distance axis 302 and the vertical axis of the exemplary graph is an influence axis 304. The influence distribution curve 262 specifies a fraction of influence from 0.0 through 1.0, where 0.0 corresponds to no influence and 1.0 corresponds to maximum influence, based on values for chkDist 312 from 0 to spread 264. In the context of the exemplary graph, points are expressed as (x, y), where x is a value along the distance axis 302 and y is a value along the influence axis 304.

As depicted via the circle numbered 1, in some embodiments, the curve influence engine 320 sets a diagonal percentage (diagPct) 322 equal to (spread 264–chkDist 312)/spread 264. As depicted via the circle numbered 2, the curve influence engine 320 plots a diagonal 330 and a diagonal point (pntD) 340 that lies at the diagPct 322 along the diagonal 330. The diagonal 330 is a straight line having end points at (0, 0) and (spread 264, 1.0).

In some embodiments, and as depicted via the circle numbered "3," the curve influence engine 320 projects the pntD 340 onto the distance axis 302 to determine a flat point (pntF) 350. As shown, the x coordinate value of pntF 350 is therefore equal to the x coordinate value of pntD 340, and the y coordinate value of pntF 350 is equal to 0. As depicted via the circle numbered "4," the curve influence engine 320 projects the pntF 350 onto the influence distribution curve 262 to determine a projection point (pntP) 360.

In some embodiments, the curve influence engine 320 divides the y coordinate value of pntP 360 by the y coordinate value of pntD 340 to compute a y ratio (not shown). As depicted via the circle numbered "5," in the same or other embodiments, the curve influence engine 320 sets the z displacement value 370 equal to (diagPct 322)×(lift 266)×(y ratio). The curve influence engine 320 then outputs the z displacement value 370. As noted previously herein, the displacement engine 220(1) stores the z displacement value 370 in the layer displacement field 222(1) as a z displacement value for the specific 2D point corresponding to the chkDist 312.

In some embodiments, after the displacement engine 220(1) generates the layer displacement field 222(1), the interaction engine 380 generates the displacement field 228(1) based on the displacement field 228(0), the layer displacement field 222(1), the layer position 256(1), and the interaction type 268. More precisely, to generate the displacement field 228(1), the interaction engine 380 modifies zero or more of the z displacement values specified in the displacement field 228(0) based on corresponding z displacement values specified in the layer displacement field 222(1) as per the layer position 256(1) and the interaction type 268.

In some embodiments, the interaction engine 380 translates the layer displacement field 222(1) from the frame of reference of the layer base surface 258 into the frame of reference of the base surface 252 as per the layer position 256(1) to generate a translated layer displacement field (not shown). For each non-zero, layer-specific z displacement value included in the translated layer displacement field, the interaction engine 380 updates the z displacement value included in the displacement field 228(0) that corresponds to the same 2D point based on the layer-specific z displacement value as per the interaction type 268.

In some embodiments, the interaction type 268 determines how the influence of the gradient layer 260(1) modifies the displacement values included in the displacement field 228(0). In the same or other embodiments, the interaction type 268 therefore determines how the interaction engine 380 aggregates or blends the translated layer displacement field into the displacement field 228(0) to generate the displacement field 228(1).

In some embodiments, if the interaction type 268 is not specified, then the interaction engine 380 sets the interaction type 268 to a default interaction type of sum. In the same or other embodiments, if the interaction type 268 is sum, then the interaction engine 380 adds each layer-specific z displacement value specified in the translated layer displacement field to the corresponding z displacement value included in the displacement field 228(0) to generate the displacement field 228(1).

As shown, the interaction engine 380 and/or the displacement engine 220(1) outputs the displacement field 228(1). In some embodiments, the displacement engine 220(1) also outputs the layer displacement field 222(1). In the same or other embodiments, the displacement engine 220(1) generates a displacement map (not shown) based on the displacement field 228(1) and/or a layer displacement map (not shown) based on the layer displacement field 222(1). As described previously herein in conjunction with FIGS. 1 and 2, in some embodiments, each displacement map is a bitmap. In the same or other embodiments, each displacement map represents a corresponding displacement field as a grayscale image or color image, where the intensities or colors, respectively, of the pixels indicate z displacement values for corresponding 2D points.

Figure 4:
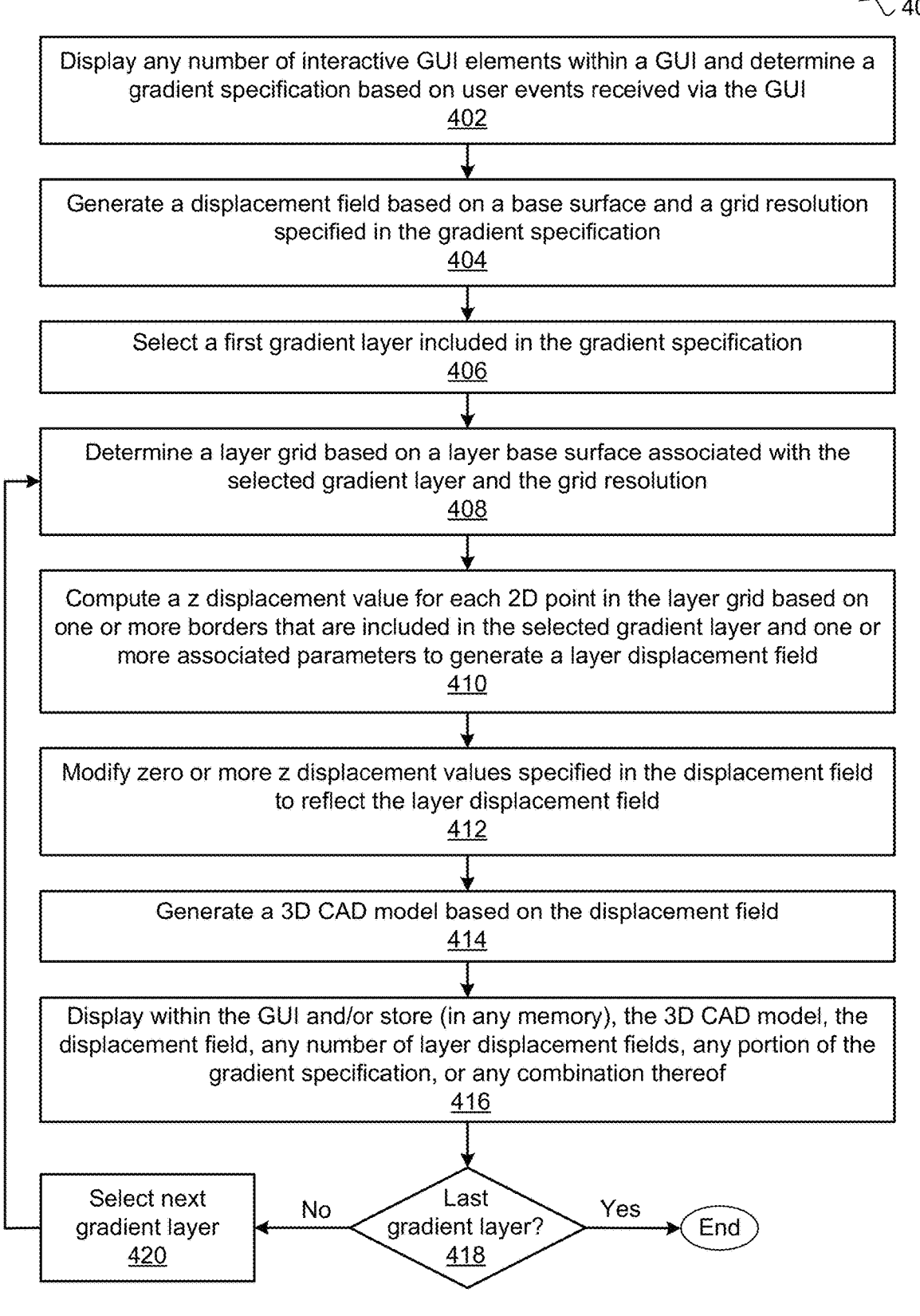
FIG. 4 is a flow diagram of method steps for automatically generating 3D object designs, according to various embodiments.

FIG. 4 is a flow diagram of method steps for automatically generating 3D object designs, according to various embodiments. Although the method steps are described with reference to the systems of FIGS. 1-3, persons skilled in the art will understand that any system configured to implement the method steps, in any order, falls within the scope of the present invention.

As shown, a method 400 begins at step 402, where the GUI engine 132 displays any number of interactive GUI elements within the GUI 140 and determines a gradient specification based on user events received via the GUI 140. At step 404, the gradient engine 170 generates a displacement field based on a base surface and a grid resolution that are specified in the gradient specification.

At step 406, the gradient engine 170 selects a first gradient layer included in the gradient specification. At step 408, the gradient engine 170 determines a layer grid based on a layer base surface that is associated with the selected gradient layer and the grid resolution. At step 410, the gradient engine 170 computes a z displacement value for each 2D point in the layer grid based on one or more borders included in the selected gradient layer and one or more associated parameters to generate a layer displacement field. At step 412, the gradient engine 170 modifies zero or more z displacement values specified in the displacement field to reflect the layer displacement field.

At step 414, the gradient engine 170 generates a 3D CAD model representing a 3D object design based on the displacement field. At step 416, the GUI engine 132 displays within the GUI 140 and/or the gradient modeling application 130 stores (in any memory), the 3D CAD model, the displacement field, any number of layer displacement fields, any portion of the gradient specification, or any combination thereof.

At step 418, the gradient engine 170 determines whether the selected gradient layer is the last gradient layer included in the gradient specification. If, at step 418, the gradient engine 170 determines that the selected gradient layer is not the last gradient layer included in the gradient specification, then the method 400 proceeds to step 420. At step 420, the gradient engine 170 selects the next gradient layer included in the gradient specification. The method 400 then returns to step 408, where the gradient engine 170 determines a layer grid based on a layer base surface that is associated with the selected gradient layer and the grid resolution.

If, however, at step 418, the gradient engine 170 determines that the selected gradient layer is the last gradient layer included in the gradient specification, then the method 400 terminates.

In sum, the disclosed techniques enable 3D object designs to be efficiently generated based on gradient specifications that describe target curvatures. In some embodiments, a gradient modeling application generates and displays, within a GUI, any number and/or types of GUI elements that allow a user to specify any number of gradient specifications. In some embodiments, based on user events received via the GUI, the gradient modeling application generates a gradient specification. In some embodiments, the gradient specification includes, without limitation, a base surface, a grid resolution, one or more gradient layers, and the position of each gradient layer with respect to an xy-plane associated with the base surface. Each gradient layer includes, without limitation, one or more border sets and values for any number and/or types of parameters that control how the border sets influence the displacement of points along a z-axis based, at least in part, on the 2D positions of the points in an xy-plane.

In some embodiments, the gradient modeling application samples the base surface based on the grid resolution to generate a first version of a displacement field, where a z displacement value of each point in the first version of the displacement field is equal to zero. The gradient modeling application successively applies each gradient layer included in the gradient specification to the most recently generated version of the displacement field to generate a new version of the displacement field. More precisely, for i is an integer that ranges from 1 through the total number of gradient layers, the gradient modeling application selects the subset of points in the disparagement field that are associated with the $i^{th}$ layer. For each selected point, the gradient modeling application computes a layer-specific z displacement value based on the one or more border sets included in the $i^{th}$ layer and the associated parameter values. The gradient modeling application then modifies the $i^{th}$ version of the displacement field based on the layer-specific displacement values to generate an $(i+1)^{th}$ version of the displacement field.

After generating the last version of the displacement field, the gradient modeling application optionally displays the displacement field within the GUI. In some embodiments, the gradient modeling application stores the displacement field and the gradient specification in a memory. Based on the displacement field and in response to any number and/or types of user events received via the GUI, the gradient modeling application can subsequently generate any number of 3D CAD models representing any number of 3D object designs.

At least one technical advantage of the disclosed techniques relative to the prior art is that, with the disclosed techniques, 3D object designs can be automatically and accurately generated based on parameterized borders representing target curvatures. In that regard, the disclosed techniques allow the depth values of points included in a 3D object design to be automatically adjusted based on distances to parameterized borders, thereby enabling complex 3D curvilinear shapes to be accurately defined and interactively refined based on any number and/or types of requirements and/or preferences. Accordingly, with the disclosed techniques, 3D object designs that satisfy functional requirements while taking into account functional and/or stylistic preferences can be generated automatically and efficiently—something that was not possible with prior art approaches.

Consequently, the disclosed techniques can improve the overall quality of 3D object designs relative to what can be achieved using prior art CAD tools. These technical advantages provide one or more technological improvements over prior art techniques.

1. In some embodiments, a computer-implemented method for automatically generating designs of three-dimensional (3D) objects comprises generating a plurality of points based on a resolution and a perimeter; computing a plurality of displacement values based on the plurality of points, a first two-dimensional (2D) border, and a first value for a first displacement parameter that is associated with the first 2D border; and generating a first 3D object design based on the plurality of displacement values.

2. The computer-implemented method of clause 1, wherein the first 2D border comprises at least one of a 2D curve or a 2D point.

3. The computer-implemented method of clauses 1 or 2, wherein the first value for the first displacement parameter specifies a distribution defining a degree of influence that the first 2D border exerts on a 2D point based on a distance between the first 2D border and the 2D point.

4. The computer-implemented method of any of clauses 1-3, wherein computing the plurality of displacement values comprises computing a first displacement value by computing a first distance between the first 2D border and a first point included in the plurality of points; and computing the first displacement value based on the first distance and the first value for the first displacement parameter.

5. The computer-implemented method of any of clauses 1-4, wherein computing the plurality of displacement values comprises computing a first displacement value by determining that a first point included in the plurality of points is influenced by the first 2D border based on a first 2D position of the first point; and computing the first displacement value based on the first value for the first displacement parameter.

6. The computer-implemented method of any of clauses 1-5, wherein computing the plurality of displacement values comprises computing a first displacement value by computing a degree of influence that a set of 2D borders that includes the first 2D border has on a first point included in the plurality of points based on a first 2D position of the first point and the first value for the first displacement parameter; and computing the first displacement value based on the degree of influence and a displacement limit associated with the set of 2D borders.

7. The computer-implemented method of any of clauses 1-6, further comprising receiving, via a graphical user interface (GUI), a user event corresponding to an interaction between a user and an interactive GUI element; and determining the first 2D border or the first value for the first displacement parameter based on the user event.

8. The computer-implemented method of any of clauses 1-7, wherein generating the first 3D object design comprises modifying a displacement field associated with an overall surface based on the plurality of displacement values and at least one of a blending mode or a position of the perimeter within the overall surface.

9. The computer-implemented method of any of clauses 1-8, further comprising generating a displacement field based on the plurality of displacement values, a second 2D border, and a second value for the first displacement parameter.

10. The computer-implemented method of any of clauses 1-9, further comprising converting the plurality of displacement values to a bitmap; and modifying a target portion of a target 3D object design based on the bitmap to generate a second 3D object design.

11. In some embodiments, one or more non-transitory computer readable media include instructions that, when executed by one or more processors, cause the one or more processors to automatically generate designs of three-dimensional (3D) objects by performing the steps of generating a plurality of points based on a resolution and a perimeter; computing a plurality of displacement values based on the plurality of points, a first two-dimensional (2D) border, and a first value for a first displacement parameter that is associated with the first 2D border; and generating a first 3D object design based on the plurality of displacement values.

12. The one or more non-transitory computer readable media of clause 11, wherein the first displacement parameter comprises a maximum outward displacement or a maximum inward displacement.

13. The one or more non-transitory computer readable media of clauses 11 or 12, wherein the first value for the first displacement parameter specifies a line, a Bezier curve, or a Non-Uniform Rational B-Spline curve that defines a degree of influence that the first 2D border exerts on a 2D point based on a distance between the first 2D border and the 2D point.

14. The one or more non-transitory computer readable media of any of clauses 11-13, wherein computing the plurality of displacement values comprises computing a first displacement value by computing a first distance between the first 2D border and a first point included in the plurality of points; and computing the first displacement value based on the first distance and the first value for the first displacement parameter.

15. The one or more non-transitory computer readable media of any of clauses 11-14, wherein computing the plurality of displacement values comprises computing a first displacement value by determining that a first point included in the plurality of points is influenced by a plurality of 2D borders that includes the first 2D border based on a first 2D position of the first point and the first value for the first displacement parameter; and computing the first displacement value based on the first 2D position of the first point.

16. The one or more non-transitory computer readable media of any of clauses 11-15, wherein generating the first 3D object design comprises modifying a displacement field associated with an overall surface based on the plurality of displacement values and at least one of a blending mode or a position of the perimeter within the overall surface.

17. The one or more non-transitory computer readable media of any of clauses 11-16, further comprising converting the plurality of displacement values to a bitmap; and modifying a target portion of a target 3D object design based on the bitmap to generate a second 3D object design.

18. The one or more non-transitory computer readable media of any of clauses 11-17, wherein the first 3D object design comprises a computer-aided design model.

19. The one or more non-transitory computer readable media of any of clauses 11-18, wherein the perimeter comprises an outline of a target surface included in a target 3D object design or a 2D bounding box.

20. In some embodiments, a system comprises one or more memories storing instructions and one or more processors coupled to the one or more memories that, when executing the instructions, perform the steps of generating a plurality of points based on a resolution and a perimeter; computing a plurality of displacement values based on the plurality of points, a first two-dimensional (2D) border, and a first value for a first displacement parameter that is associated with the first 2D border; and generating a first 3D object design based on the plurality of displacement values.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for automatically generating designs of three-dimensional (3D) objects, the method comprising:
    generating a plurality of points based on a grid resolution for an overall grid of 2D points associated with a base surface;
    computing a plurality of displacement values based on the plurality of points; and
    generating a first 3D object design based on the plurality of displacement values.

2. The computer-implemented method of claim 1, wherein the plurality of displacement values is further computed based on at least one of a first two-dimensional (2D) border or a first value for a first displacement parameter that is associated with the first 2D border.

3. The computer-implemented method of claim 2, wherein the first 2D border comprises at least one of a 2D curve or a 2D point.

4. The computer-implemented method of claim 2, wherein computing the plurality of displacement values comprises computing a first distance between the first 2D border and a first point included in the plurality of points, and computing a first displacement value based on the first distance and the first value for the first displacement parameter.

5. The computer-implemented method of claim 2, wherein computing the plurality of displacement values comprises determining that a first point included in the plurality of points is influenced by the first 2D border based on a first 2D position associated with the first point, and computing a first displacement value based on the first value for the first displacement parameter.

6. The computer-implemented method of claim 1, wherein the plurality of displacement values is further computed based on a first two-dimensional (2D) border.

7. The computer-implemented method of claim 6, wherein the plurality of displacement values is further computed based on a first value for a first displacement parameter that is associated with the first 2D border.

8. The computer-implemented method of claim 7, wherein the first value for the first displacement parameter specifies a distribution defining a degree of influence that the first 2D border exerts on a 2D point based on a distance between the first 2D border and the 2D point.

9. The computer-implemented method of claim 1, wherein computing the plurality of displacement values comprises:
    computing a degree of influence that a set of 2D borders that includes a first 2D border has on a first point included in the plurality of points based on a first 2D position associated with the first point and a first value for a first displacement parameter; and
    computing a first displacement value based on the degree of influence and a displacement limit associated with the set of 2D borders.

10. The computer-implemented method of claim 1, further comprising:
    receiving, via a graphical user interface (GUI), a user event corresponding to an interaction between a user and an interactive GUI element; and
    determining a first 2D border or a first value for a first displacement parameter based on the user event.

11. The computer-implemented method of claim 1, wherein generating the first 3D object design comprises modifying a displacement field associated with an overall surface based on the plurality of displacement values and at least one of a blending mode or a position of a perimeter within the overall surface.

12. The computer-implemented method of claim 1, further comprising generating a displacement field based on the plurality of displacement values, a 2D border, and a first value for a first displacement parameter.

13. The computer-implemented method of claim 1, further comprising:
    converting the plurality of displacement values into a bitmap; and
    modifying a target portion of a target 3D object design based on the bitmap to generate a second 3D object design.

14. One or more non-transitory computer readable media including instructions that, when executed by one or more processors, cause the one or more processors to automatically generate designs of three-dimensional (3D) objects by performing the steps of:
    generating a plurality of points based on a grid resolution for an overall grid of 2D points associated with a base surface;
    computing a plurality of displacement values based on the plurality of points; and
    generating a first 3D object design based on the plurality of displacement values.

15. The one or more non-transitory computer readable media of claim 14, wherein the plurality of displacement values is further computed based on at least one of a first two-dimensional (2D) border or a first value for a first displacement parameter that is associated with the first 2D border.

16. The one or more non-transitory computer readable media of claim 15, wherein the first 2D border comprises at least one of a 2D curve or a 2D point.

17. The one or more non-transitory computer readable media of claim 14, wherein the plurality of displacement values is further computed based on a first two-dimensional (2D) border.

18. The one or more non-transitory computer readable media of claim 17, wherein the plurality of displacement values is further computed based on a first value for a first displacement parameter that is associated with the first 2D border.

19. The one or more non-transitory computer readable media of claim 18, wherein the first value for the first displacement parameter specifies a distribution defining a degree of influence that the first 2D border exerts on a 2D point based on a distance between the first 2D border and the 2D point.

20. A system comprising:

one or more memories storing instructions; and one or more processors coupled to the one or more memories that, when executing the instructions, perform the steps of:

generating a plurality of points based on a grid resolution for an overall grid of 2D points associated with a base surface;

computing a plurality of displacement values based on the plurality of points; and generating a first 3D object design based on the plurality of displacement values.

\* \* \* \* \*